US005982158A

United States Patent [19]

Schnars et al.

[11] Patent Number: 5,982,158

[45] Date of Patent: Nov. 9, 1999

[54] SMART IC POWER CONTROL

[75] Inventors: Michael John Schnars, Clarkston; Raymond Lippmann, Howell; James Edward Nelson, North Branch, all of Mich.

[73] Assignee: Delco Electronics Corporaiton, Kokomo, Ind.

[21] Appl. No.: 09/293,892

[22] Filed: Apr. 19, 1999

[51] Int. Cl.[6] .......... G05F 1/40; H03F 1/36

[52] U.S. Cl. .......... 323/273; 323/281; 323/284; 330/109

[58] Field of Search .......... 323/273, 274, 323/280, 281, 284; 330/109

[56] References Cited

U.S. PATENT DOCUMENTS

| | | | |
|---|---|---|---|
| 4,456,833 | 6/1984 | Traub et al. | 323/268 |
| 4,881,023 | 11/1989 | Perusse et al. | 323/266 |
| 5,025,204 | 6/1991 | Su | 323/274 |
| 5,629,609 | 5/1997 | Nguyen et al. | 323/269 |
| 5,648,718 | 7/1997 | Edwards | 323/274 |
| 5,686,821 | 11/1997 | Brokaw | 323/273 |
| 5,828,206 | 10/1998 | Hosono et al. | 323/273 |

*Primary Examiner*—Peter S. Wong
*Assistant Examiner*—Bao Q. Vu
*Attorney, Agent, or Firm*—Jimmy L Funke

[57] ABSTRACT

A voltage regulator circuit having a series device external to an integrated circuit voltage regulator. The external series device provides a voltage drop prior to the voltage being input to the voltage regulator during high power applications. Depending on the power level, low or high, one of two transistors will be activated. For low power applications, a transistor attached directly to the input voltage is active and the external series device is bypassed. For high power applications, the external series device provides a voltage drop prior to the input voltage reaching the second transistor thereby lowering the power to be dissipated by the integrated circuit.

6 Claims, 3 Drawing Sheets

SMART IC POWER CONTROL

TECHNICAL FIELD

The present invention relates to a voltage regulator and more particularly, the present invention relates to power dissipation of a voltage regulator.

BACKGROUND OF THE INVENTION

An alternator, as in an automotive application, provides a voltage to the vehicle's load circuits. The voltage supplied by the alternator is subject to wide variations and transients that can be harmful to the circuits. Typically, a voltage regulator is used to provide a constant voltage. The voltage regulator takes a voltage directly from the alternator, or battery, and changes it to the desired voltage while suppressing any transients.

Typically, in automotive applications, the voltage is reduced from a nominal vehicle level, typically nine to sixteen volts, to a desired voltage level by a series regulator. In a series regulator the current used by any load circuit passes through the regulator. The product of the voltage across the regulator and the current through the regulator is the power dissipated by the regulator. This power dissipation by the regulator causes the temperature of the regulator to rise, thereby limiting the amount of current it can deliver to a load circuit at a fixed voltage. The package of the regulator limits the amount of heat that can be dissipated at a steady state fixed rate from the regulator, which is typically an integrated circuit die. As the power dissipation increases, the temperature of the regulator package and integrated circuit die also increase. Manufacturer specifications determine how much power can be reliably dissipated by the regulator package before the integrated circuit is adversely affected. Typically, at power levels above the manufacturer's specifications the integrated circuit die becomes separated from the regulator package, resulting in failure of the voltage regulator.

The cost of an integrated circuit depends on the cost of the integrated circuit die, or inner workings of the circuit, and the cost of the integrated circuit package, or the outer housing of the integrated circuit. As would be expected, the package for an integrated circuit capable of dissipating high power is expensive.

Methods exist for overcoming the limitations of the integrated circuit package power dissipation capabilities. One method is to employ a heatsink on the integrated circuit package thereby extending the power dissipation capability of the integrated circuit package. Another method is to employ a transistor that is external to the integrated circuit for dissipating the power. This method reduces the amount of power that must be dissipated by the integrated circuit, and allows the voltage regulator to be provided in a less expensive package. However, the regulator circuit becomes more difficult to design because the external components adversely affect the stability of the integrated circuit. Additionally, because of the external components, the package cost of the system integrated circuit is increased.

On the one hand, the output voltage must be kept at a specific value, five volts for example. High input voltages to the integrated circuit will require maximum power dissipation and it would be beneficial to reduce the voltage externally before it reaches the integrated circuit. On the other hand, the regulator must be capable of operating at low input voltages in which case it becomes undesirable to have an external power drop before the regulator integrated circuit. Having to simultaneously meet these two diametrically opposing conditions exemplifies how difficult it is to control the power dissipation in a voltage regulator integrated circuit.

SUMMARY OF THE INVENTION

The present invention is an integrated circuit voltage regulator having the capability to effectively dissipate power at both low and high input voltages. The voltage regulator of the present invention includes first and second operational amplifiers, a comparator, three resistors, first and second transistors and an external resistor attached to the input of the integrated circuit. There is no need for external transistors or heat sinks.

The comparator determines which of the operational amplifiers and its associated transistor will deliver power to the load circuit. A predetermined voltage level is set for the comparator to switch between amplifiers. Hysterysis is applied to the switch point to ensure stability.

For higher input voltages, the input voltage to the integrated circuit passes through the external series device causing a voltage drop across the device, thereby lowering the input voltage to the integrated circuit and a lower voltage is applied to one of the transistors. The power to be dissipated by the integrated circuit package is now decreased by the load current multiplied by the voltage drop across the external series device.

For lower input voltages, the external resistor is bypassed and the input voltage is used directly by the other transistor. Thereby enabling the voltage regulator to provide low drop out operation.

In another embodiment of the present invention, a shunt device is used in conjunction with the external series device. Effectively, the combination of the shunt device and external series device creates a pre-regulator further enhancing the power dissipation of the integrated circuit package. The pre-regulator decreases the power to the integrated circuit thereby reducing the amount of power that needs to be dissipated.

It is an object of the present invention to provide an integrated circuit voltage regulator capable of operating effectively at both high and low input voltages. It is another object of the present invention to provide an integrated circuit voltage regulator having a cost effective package and die. It is still another object of the present invention to improve the power dissipation capability of an integrated circuit voltage regulator.

Other objects and features of the present invention will become apparent when viewed in light of the detailed description of the preferred embodiment when taken in conjunction with the attached drawings and appended claims.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
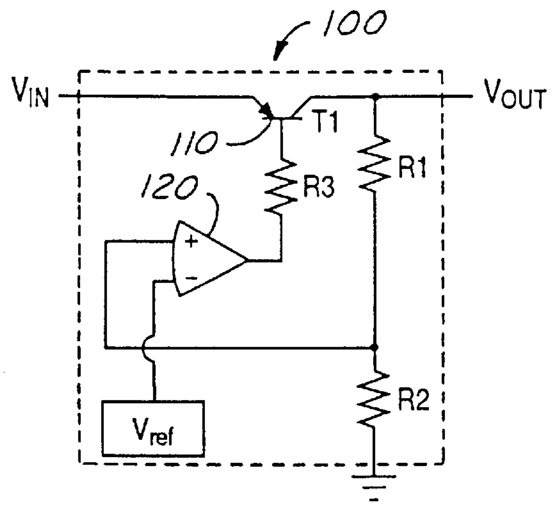
(PRIOR ART) FIG. 1
FIG. 1 is a schematic of a prior art integrated circuit voltage regulator.

For comparison purposes a prior art integrated circuit voltage regulator 100 is shown in FIG. 1. An input voltage $V_{IN}$ is supplied at the input of the voltage regulator 100. Transistor 110 is used to drop the voltage from the input level $V_{IN}$ to the desired output level $V_{OUT}$ that is ultimately supplied to a load circuit (not shown). A voltage divider, R1 and R2, feeds back part of the output voltage $V_{OUT}$ to an operational amplifier 120 for comparison to an internal reference voltage, $V_{REF}$. Operational amplifier 120 adjusts the conduction of transistor 110 to maintain the output voltage $V_{OUT}$ at the desired value and avoid transients. Resistor, R3, is used to limit the current into the integrated circuit from the base of the transistor 110. The transistor 110 may be a bipolar or field effect transistor. For a field effect transistor, resistor R3 is not necessary.

The transistor 110 is shown as part of the integrated circuit. However, for high power applications the transistor 110 is typically moved off of the integrated circuit and is provided as an external component (not shown). As an external component, a separate power package for the transistor is required, thereby increasing the cost of the voltage regulator.

In operation, the voltage regulator 100 will regulate to an input voltage that is higher than the output voltage plus the minimum voltage drop across the transistor 110 (typically, one-half volt). The power dissipation in transistor 110 will control the maximum operating voltage for a fixed load current.

Figure 2:
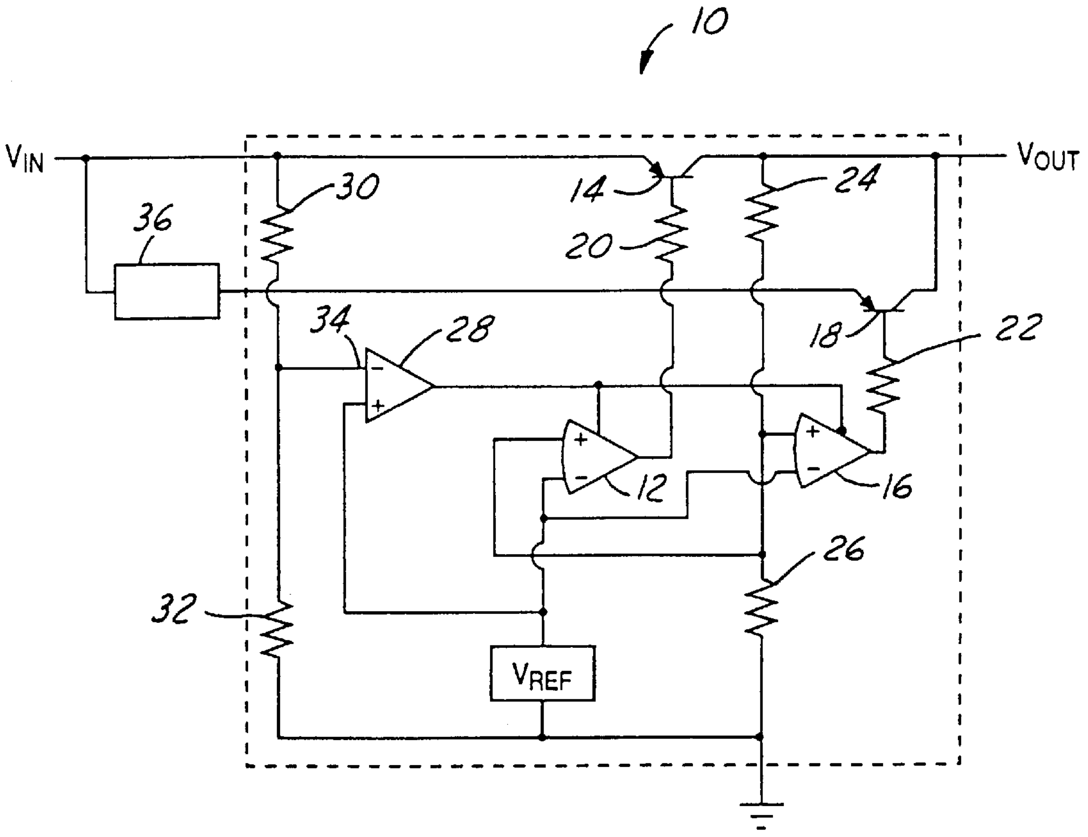
FIG. 2 is a schematic of the integrated circuit voltage regulator of the present invention.

FIG. 2 is a schematic representation of the voltage regulator 10 of the present invention. The voltage regulator 10 has a first operational amplifier 12 coupled to a first transistor 14 and a second operational amplifier 16 coupled to a second transistor 18. Resistors 20 and 22 limit the current at the base of transistors 14 and 18 respectively. A voltage divider consisting of resistors 24 and 26 is also provided. A comparator 28 having resistors 30 and 32 on inverting input 34, is used to switch between operational amplifiers 12 and 16. Resistors 30 and 32 are a voltage divider to the comparator 28 for a comparison with the reference voltage $V_{REF}$ to determine when the comparator 28 should switch between transistors 14 and 18.

The dashed line in FIG. 2 defines the components of the voltage regulator 10 that are located in an integrated circuit. An external series device 36 is provided at the input of the integrated circuit voltage regulator 10. The external series device 36 is not a part of the integrated circuit and is part of the voltage regulator 10 that is located outside of the integrated circuit package. The external series device 36 is any device placed in series with the voltage regulator that handles a voltage drop. For example, a resistor, a variable resistor, a voltage variable resistor, a transistor, a semiconductor, etc. These listed devices are for example purposes only. One skilled in the art is capable of substituting another device to accomplish results similar to those of the examples listed above.

In operation, the comparator 28 is used to determine which amplifier, 12 and 16, and transistor 14 and 18, will be used to provide power to the load circuit (not shown). The comparator 28 is set to a predetermined input voltage. In the present example, this value is 12.6 Volts, which is a value below the normal vehicle operating level in an automotive application. This value was chosen so that electrical noise will not cause continual switching between transistors. Hysterysis is applied to the switch point to insure stability.

For voltages above the switch point, 12.6 Volts in the present example, transistor 18 is active. The input voltage, $V_{IN}$, enters the integrated circuit voltage regulator 10 through the external series device 36 and then to the active transistor 18. The load current, $I_{load}$, passes through the external series device 36 and the transistor 18. The current through the external series device 36 causes a voltage drop across the device, thereby lowering the voltage that is applied to the integrated circuit voltage regulator 10. The lower voltage is then applied to transistor 18. The power required to be dissipated by the integrated circuit voltage regulator 10 is now decreased by the product of the load current and the voltage drop across the external series device 36.

In practice the external series device 36 is any device that can be used to control the voltage to the integrated circuit. For example, a resistor, a voltage variable resistor, a semiconductor, a transistor, etc. It is possible to employ a device, such as a voltage variable resistor, that drops the voltage depending on the load characteristics. These devices are set forth by way of example only and one skilled in the art is capable of substituting other devices to accomplish results similar to the present invention without departing from the scope of the present invention.

Figure 3:
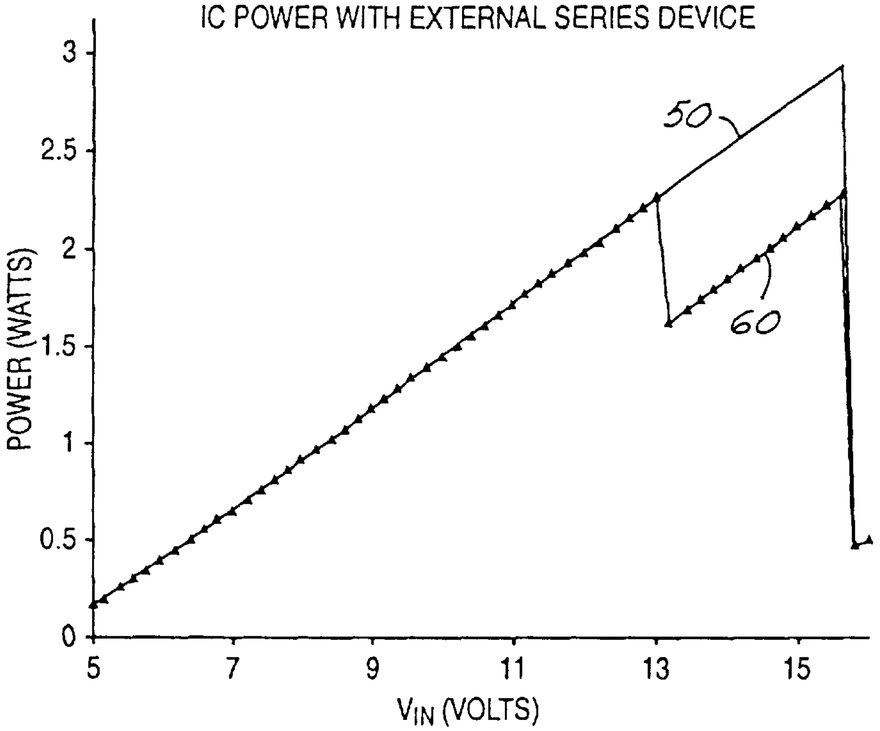
FIG. 3 is a graphical representation of the power dissipation capabilities of the voltage regulator of the present invention in comparison to a prior art voltage regulator.

FIG. 3 is a graphical representation of the power to be dissipated in a prior art voltage regulator 50 as shown in FIG. 1 in comparison to the power to be dissipated in the voltage regulator of the present invention 60 (as shown in FIG. 2). FIG. 3 shows that the power to be dissipated 60 by the voltage regulator of the present invention is lowered significantly from that of prior art regulators for high power operation. High power operation is defined as is input voltages that exceed a predetermined level, i.e. 12.6 Volts in the present example.

In the present invention, the voltage drop across the external series device reduces the power to be dissipated by the integrated circuit and the comparator directs the input voltage to the proper amplifier and transistor combination for regulation.

For low power applications, the prior art device and the regulator of the present invention operate similarly as shown by the simultaneous plots for both devices at low power. It becomes clear that the voltage regulator of the present invention can be used effectively for both low and high power applications, unlike prior art devices that require an external heatsink, an external transistor, or an expensive integrated circuit package to effectively dissipate power at high voltages.

Referring again to FIG. 2, the present invention 10 will be described in operation with low voltages. Low voltage in the present example is within the range of approximately 3 to 9 volts. In general, low voltage is any input voltage that is within close range of the desired output voltage.

For low power applications, the transistor 14 that is connected directly to the input voltage is active. The external series device 36 is bypassed, and therefore no voltage drop occurs before the voltage is input to the voltage regulator 10. This allows the voltage regulator to be used in both low and high power applications. It should be noted that transistors 14 and 18 need not be the same. For example, for low voltage operation, 14 may be a pnp. Transistor 18 may be npn which is a smaller device at a lower cost and has stability advantages over pnp transistors.

Figure 4:
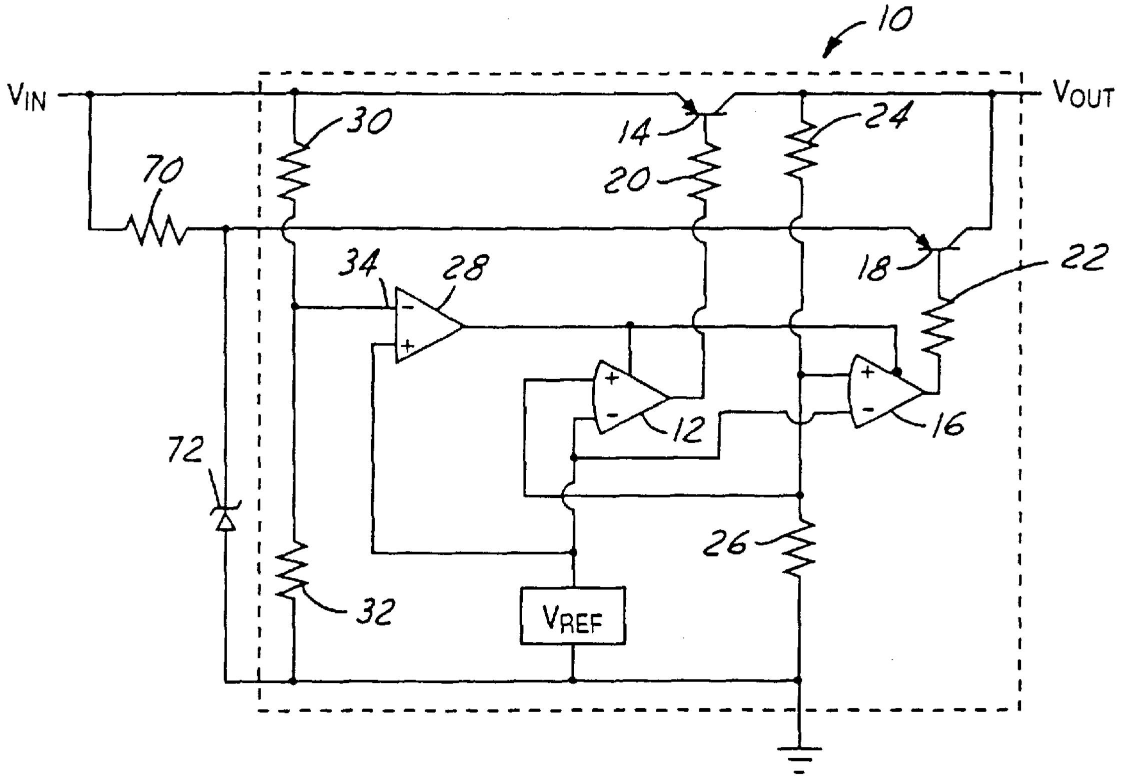
FIG. 4 is a schematic of another embodiment of the integrated circuit voltage regulator of the present invention having a series shunt device.

As discussed above, there are many possible devices that can be used as the external series device. One particular example of an external series device is shown in FIG. 4. The integrated circuit voltage regulator is the same as shown in FIG. 2, with the same reference numerals and dashed line indicating elements located inside the integrated circuit. However, the external series device is shown as an external series resistor 70 and a series shunt device 72, shown as a Zener diode in the present example. It should be noted that a Zener diode is shown for example purposes only and one skilled in the art knows that series shunt control can be accomplished with other devices as well. The series shunt device 72 turns the resistor 70 into a pre-regulator that further reduces the power to be dissipated by the voltage regulator.

Figure 5:
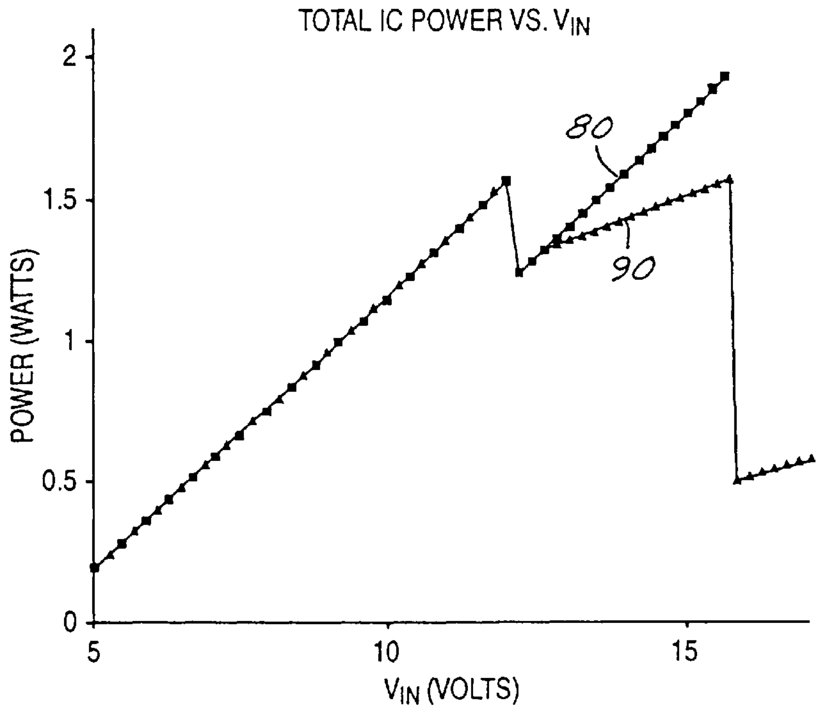
FIG. 5 is a graphical representation of the power dissipation capabilities of the integrated circuit voltage regulator shown schematically in FIG. 4.

FIG. 5 is a graphical representation of how the power dissipation is improved with the series shunt device described in FIG. 4. Plot 80 is a graph of the power to be dissipated by a voltage regulator of the present invention without series shunt control. Plot 90 is a graph of the power to be dissipated by a voltage regulator having external series shunt control. The power to be dissipated is significantly lower, approximately one-half watt, merely by the addition of series shunt control.

Figure 6:
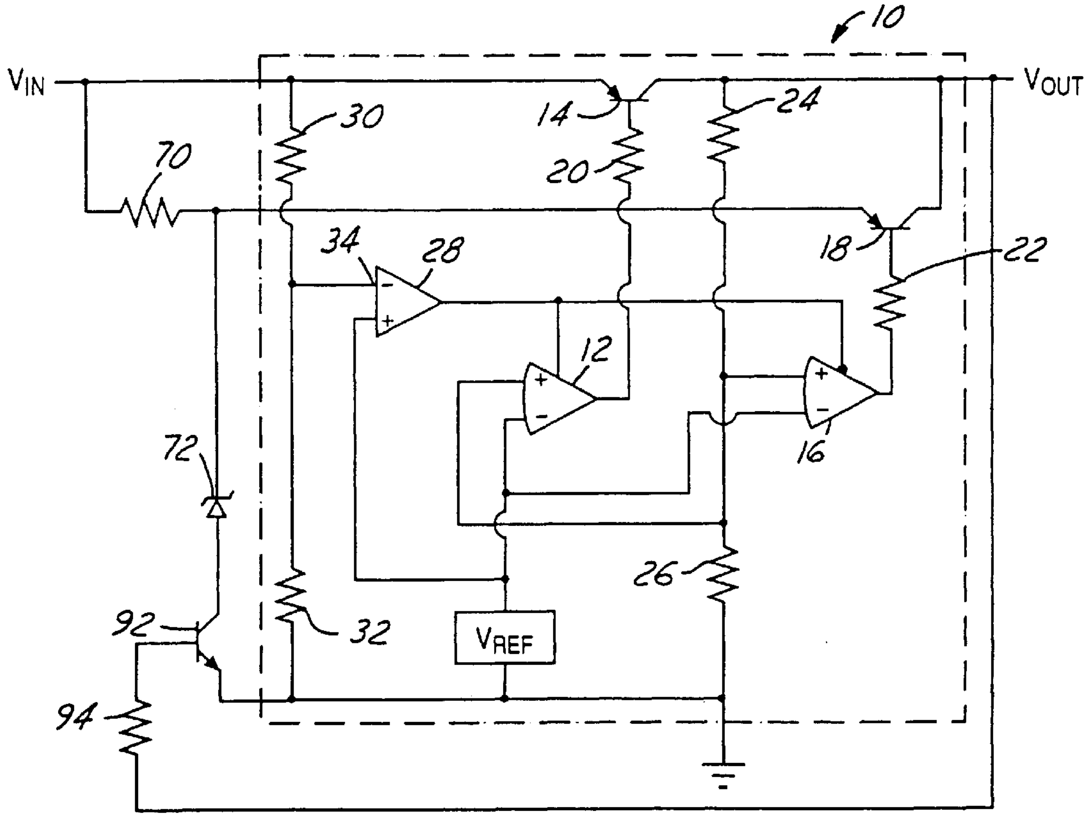
FIG. 6 is a schematic of another embodiment of the integrated circuit voltage regulator of the present invention having a bipolar transistor for controlling the operation of the series shunt device.

FIG. 6 is a schematic of another embodiment of the present invention in which the external series device has a bipolar transistor 92 in series with the shunt device 72. The bipolar transistor 92 controls the shunt device 72 turning it on and off as necessary. Resistor 94 limits the current through the transistor 92.

While particular embodiments of the invention have been shown and described, numerous variations and alternate embodiments will occur to those skilled in the art. Accordingly, it is intended that the invention be limited only in terms of the appended claims.

We claim:

1. A voltage regulator circuit for regulating an input voltage to a predetermined output voltage, said voltage regulator circuit comprising:

a first transistor attached directly to said input voltage;

a first operational amplifier attached to said first transistor;

a second transistor;

a second operational amplifier attached to said second transistor;

a comparator attached to said first and second operational amplifiers for switching between said first and second operational amplifiers;

a reference voltage applied to said first and second operational amplifiers and to said comparator;

a voltage divider attached to said comparator;

a voltage divider attached to said first and second operational amplifiers for feeding back said output voltage to one of said first and second operational amplifiers;

whereby said first and second operational amplifiers, said first and second transistors, said comparator, said reference voltage and said voltage dividers are all located on an integrated circuit;

a series device external to said integrated circuit, said series device connected to said input voltage and said second transistor for providing a voltage drop before said input voltage reaches said second transistor.

2. The voltage regulator circuit as claimed in claim 1 wherein said series device further comprises a resistor.

3. The voltage regulator circuit as claimed in claim 2 wherein aid resistor is a voltage variable resistor.

4. The voltage regulator circuit as claimed in claim 1 wherein said series device further comprises shunt control.

5. The voltage regulator circuit as claimed in claim 4 wherein said shunt control further comprises a Zener diode.

6. The voltage regulator circuit as claimed in claim 4 wherein said series device further comprises a bipolar transistor for operating said shunt control.

* * * * *